(12) United States Patent
Ker et al.

(10) Patent No.: US 6,573,566 B2
(45) Date of Patent: Jun. 3, 2003

(54) LOW-VOLTAGE-TRIGGERED SOI-SCR DEVICE AND ASSOCIATED ESD PROTECTION CIRCUIT

(75) Inventors: Ming-Dou Ker, Hsinchu (TW);
Kei-Kang Hung, Changhua Hsien (TW); Shao-Chang Huang, Chia-Yi Hsien (TW)

(73) Assignee: United Microelectronics Corp., Hsinchu (TW)

( * ) Notice: Subject to any disclaimer, the term of this patent is extended or adjusted under 35 U.S.C. 154(b) by 137 days.

(21) Appl. No.: 09/903,072

(22) Filed: Jul. 9, 2001

(65) Prior Publication Data

US 2003/0007301 A1 Jan. 9, 2003

(51) Int. Cl.⁷ .............................................. H01L 23/62
(52) U.S. Cl. ...................................................... 257/355
(58) Field of Search ................................ 257/173, 347, 257/350, 351, 352, 355, 356, 360

(56) References Cited

U.S. PATENT DOCUMENTS

| | | | |
|---|---|---|---|
| 5,629,544 A | * 5/1997 | Voldman et al. | 257/355 |
| 5,965,917 A | * 10/1999 | Maszara et al. | 257/347 |
| 6,015,992 A | * 1/2000 | Chatterjee et al. | 257/350 |
| 6,191,453 B1 | * 2/2001 | Petruzzello et al. | 257/350 |
| 6,323,073 B1 | * 11/2001 | Yeh et al. | 438/181 |

* cited by examiner

*Primary Examiner*—Matthew Nguyen
(74) *Attorney, Agent, or Firm*—Charles C. H. Wu; Wu & Cheung, LLP

(57) ABSTRACT

A silicon-on-insulator low-voltage-triggered silicon controlled rectifier device structure that is built upon a substrate and an insulation layer. The insulation layer has a plurality of isolation structures thereon to define a device region. A first-type well and a second-type well are formed over the insulation layer. The first-type and second-type wells are connected. A first gate and a second gate are formed over the first-type well and the second-type well, respectively. The first-type well further includes a first second-type doped region and a first first-type doped region formed between the first second-type doped region and the isolation structure adjacent to the first second-type doped region. The first second-type doped region and the first first-type doped region together form a cathode of the SOI-SCR device. A second first-type doped region is formed within the first-type well between the first second-type doped region and the first gate structure adjacent to the first second-type doped region. A third first-type doped region is formed within the first and the second-type well around their junction between the first and second-type well. The second-type well further includes a second second-type doped region and a fourth first-type doped region within the second-type well between the second second-type doped region and the second gate adjacent to the second second-type doped region. The second second-type doped region and the fourth first-type doped region together form an anode of the SOI-SCR device.

32 Claims, 11 Drawing Sheets

US 6,573,566 B2

LOW-VOLTAGE-TRIGGERED SOI-SCR DEVICE AND ASSOCIATED ESD PROTECTION CIRCUIT

BACKGROUND OF THE INVENTION

1. Field of Invention

The present invention relates to an electrostatic discharge (ESD) protection circuit. More particularly, the present invention relates to a silicon-on-insulator (SOI) silicon controlled rectifier (SCR) structure and associated electrostatic discharge (ESD) protection circuit.

2. Description of Related Art

The development of silicon-on-insulator (SOI) techniques for fabricating integrated circuit (IC) has been extraordinary in recent years. SOI technique involves embedding an insulation layer within a substrate. The insulation layer extends to a region underneath semiconductor device region so that the resulting structural and physical properties of the devices are greatly improved. In general, an SOI structure has an almost perfect sub-threshold swing, no latch-up, a low off-state leakage, low operating voltage and a high current driving capacity. However, the SOI structure also causes electrostatic discharge (ESD) problems. This is mainly because buried oxide layer (the insulation layer) has a low thermal conductivity and a relatively large floating body effect.

ESD is a leading cause of semiconductor device damages during IC packaging. For a CMOS IC, high voltage ESD may lead to the destruction of the thin gate oxide layer inside a CMOS device. To reduce as much as possible the damages to integrated circuits due to ESD, an ESD protection circuit and an IC circuit chip are often integrated together. The ESD circuit is a type of switch. When an ESD incident occurs, the ESD protection circuit immediately becomes conductive, so that high voltage ESD current will be conducted via the protection circuit to the ground. Ultimately, the intense current will discharge via the ESD protection circuit instead of the IC circuit body. However, if there is no voltage surge in the neighborhood of the IC circuit, the ESD circuit will remain closed so that the IC circuit can operate normally.

In bulk/non-epitaxial CMOS manufacturing, the SCR device generally has a low hold voltage ($V_{hold}$ is about 1V). When an ESD voltage is generated, power consumed by the SCR device (power≈$I_{ESD} \times V_{hold}$) is smaller than other ESD protection circuit devices (such as a diode, MOS, BJT or field oxide device). Hence, an SCR device is capable of withstanding a higher ESD voltage in the same device area.

In sub-micron CMOS fabrication, the switching voltage of an SCR device often exceeds 30V but the breakdown voltage of a sub-micron CMOS device is lower than 20V. Consequently, an SCR device is not a suitable ESD circuit protection device on its own. To serve as an ESD protection, the ESD protection circuit needs to have a supplementary circuit added onto the same silicon chip. In the following, a few conventional ESD protection SCR devices are introduced.

FIG. 1 is a schematic cross-sectional view of a conventional ESD protection SCR device. The circuit shown in FIG. 1 is disclosed in U.S. Pat. No. 5,012,317. The SCR device is built upon a P-type substrate 10. The substrate 10 has an N-type well 12. The N-type well 12 has an N+-doped region 14a and a P+-doped region 14b that serve as a cathode of the SCR device. In addition, the P-type substrate 10 has an N+-doped region 14c and a P+-doped region 14d that serve as an anode of the SCR device. In FIG. 1, the SCR only utilizes the contact junction between the P-type substrate 10 and the N-type well 12 to trigger ESD operation. The SCR device has a relatively high switching voltage (greater than 30V in 0.35 μm CMOS process). Since the device is characterized by having a high switching voltage, additional supplementary circuit would be needed to provide a complete ESD protection circuit.

FIG. 2 is a schematic cross-sectional view of a conventional modified lateral SCR device for protecting circuit against ESD. The modified lateral SCR device is disclosed in U.S. Pat. No. 5,225,702. As shown in FIG. 2, one major modification is the addition of an N+-doped region 24c that extends into a portion of the neighboring P-type substrate 20 and the N-type well 22. Through the N+-doped diffusion region, the switching voltage of the SCR device is lowered to the breakdown voltage (about 12V for 0.35 μm CMOS devices) between the P-type substrate 20 and the N+-doped diffusion region 24c. Ultimately, the SCR device is switched at a lower voltage and damaging current is more rapidly channeled away.

FIG. 3 is a schematic cross-sectional view of a low-voltage-triggered SCR device for protecting against ESD. The design is disclosed in U.S. Pat. No. 5,453,384. As shown in FIG. 3, the device represents a further improvement to the modified SCR device shown in FIG. 2. An NMOS transistor (including a gate 44, a source terminal 38 and a drain terminal 40a) is formed above the P-type substrate 30 and the N+-doped diffusion region 38. With this arrangement, the switching voltage of the SCR device is lowered to the breakdown voltage (about 8V for 0.35 μm CMOS devices) of the NMOS transistor. Hence, switching voltage of the SCR device is further lowered without having to add a supplementary circuit to the silicon chip.

FIG. 4 is a schematic cross-sectional view of a conventional doubly stabilized SCR device and switching circuit structure fabricated on a silicon-on-insulator substrate. The design is disclosed in U.S. Pat. No. 6,015,992. As shown in FIG. 4, the doubly stabilized SCR switching circuit is built above the substrate 50 and the insulation layer 56. With the said structure, the discharging route P-N-P-N (66-54-52-58) of the SCR device is blocked by the insulation layer 80. Therefore, two groups of connecting wires 74 and 72 are added to the structure for connecting the severed P-N-P and N-P-N circuits. However, the SCR structure connected as such does not have a low switching voltage like conventional SCR device. So, it does not provide a good protection for the IC.

SUMMARY OF THE INVENTION

Accordingly, one object of the present invention is to provide a silicon-on-insulator (SOI) low-voltage-triggered silicon control rectifier (SCR) structure and associated electrostatic discharge (ESD) protection circuit.

To achieve these and other advantages and in accordance with the purpose of the invention, as embodied and broadly described herein, the invention provides a SOI partially-depleted low-voltage-triggered SCR device structure. The SCR device is built upon a substrate and an insulation layer. The insulation layer can be a buried oxide layer formed over the substrate. A plurality of isolation structures over the insulation layer defines a device region. A first-type well (for example, an N-type well) and a second-type well (for example, a P-type well) are formed over the insulation layer in the device region. The first-type and second-type wells are connected. A first gate is formed over the first-type well and a second gate is formed over the second-type well. The first-type well further includes a first second-type doped region (P-type) and a first first-type doped region (N-type) between the first second-type doped region and the isolation structure adjacent to the first second-type doped region. The first second-type doped region and the first first-type doped region together form an anode of the SOI-SCR device. A second first-type doped region is formed within the first-type well between the first second-type doped region and the first gate structure adjacent to the first second-type doped region. A third first-type doped (N-type) region is formed within the first and the second-type well around their junction between the first and second-type well. The second-type well further includes a second second-type doped (P-type) region and a fourth first-type doped (N-type) region within the second-type well between the second second-type doped region and the second gate structure adjacent to the second second-type doped region. The second second-type doped region and the fourth first-type doped region together form a cathode of the SOI-SCR device structure.

The invention also provides a second partially-depleted SOI low-voltage-triggered SCR device structure. The SCR device is formed over a substrate and an insulation layer. The insulation layer can be a buried oxide layer formed over the substrate. A plurality of isolation structures over the insulation layer defines a device region. A first-type well (for example, an N-type well) and a second-type well (for example, a P-type well) are formed over the insulation layer within the device region. The first-type and the second-type wells are connected. A first gate is formed above the first-type well and a second gate is formed above the second-type well. The first-type well has a first second-type doped region adjacent to the first gate structure and a first first-type doped region formed in the first-type well between the first second-type doped region and the isolation structure adjacent to the first second-type doped region. The first second-type doped region and the first first-type doped region are electrically connected to form an anode of the SOI-SCR device. The second second-type doped region is formed within the first and the second-type well around their junction between the first and the second-type well and in between the first and the second gate. The second first-type doped region is formed within the second-type well. A third second-type doped region is formed within the second-type well between the second first-type doped region and the isolation structure and adjacent to the second first-type doped region. The second first-type doped region and the third second-type doped region are electrically connected together to form a cathode of the SOI-SCR device structure. A fourth second-type doped region is formed within the second-type well between the second first-type doped region and the second gate adjacent to the second first-type doped region.

The invention also provides a third SOI fully-depleted low-voltage-triggered SCR device structure. The SCR device is formed over a substrate and an insulation layer. The insulation layer can be a buried oxide layer formed over the substrate. A plurality of isolation structures over the insulation layer defines a device region. A first-type well (for example, an N-type well) and a second-type well (for example, a P-type well) are formed over the insulation layer within the device region. The first-type and the second-type wells are in contact with each other. A first gate structure is formed above the first-type well and a second gate structure is formed above the second-type well. A first first-type doped region is formed within the first-type well adjacent to a portion of the sidewall of the first gate structure. A portion of a first second-type doped region is formed within the first-type well adjacent to the first first-type doped region. A second first-type doped region is formed within the device region between the first second-type doped region and the isolation structure adjacent to the first-type well. The first second-type doped region and the second first-type doped region are electrically connected together to form an anode of the SOI-SCR device. A third first-type doped region is formed within the first-type and the second-type well. The third first-type doped region is formed close to the junction between the first and the second-type well in-between a portion of the sidewall of the first and the second gate. A second second-type doped region is formed within the device region adjacent to the second-type well. A portion of the fourth first-type doped region is formed within the second-type well between the sidewall of the second second-type doped region and a portion of the sidewall of the second gate structure. The second second-type doped region and the fourth first-type doped region together form a cathode of the SOI-SCR device.

The invention also provides a fourth SOI fully-depleted low-voltage-triggered SCR device structure. The SCR device is formed over a substrate and an insulation layer. The insulation layer can be a buried oxide layer formed over the substrate. A plurality of isolation structures over the insulation layer defines a device region. A first-type well (for example, an N-type well) and a second-type well (for example, a P-type well) are formed over the insulation layer within the device region. The first-type and the second-type wells are in contact with each other. A first gate structure is formed above the first-type well and a second gate structure is formed above the second-type well. A first second-type doped region is formed within the first-type well adjacent to a portion of the sidewall of the first gate structure. A first first-type doped region is formed within the device region between the first second-type doped region and the isolation structure adjacent to the first second-type doped region. The first second-type doped region and the first first-type doped region are electrically connected together to form an anode of the SOI-SCR device. A second second-type doped region is formed within a portion of the first and the second-type well adjacent to the their junction and in-between a portion of the sidewall of the first and the second gate. A third second-type doped region is formed within the second-type well adjacent to a portion of the sidewall of the second gate structure. A second first-type doped region is formed in a portion of the second well adjacent to the third second-type doped region. A fourth second-type doped region is formed within the device region between the second first-type doped region and another isolation structure adjacent to the second-type well. The second first-type doped region and the fourth second-type doped region are electrically connected together to form a cathode of the SOI-SCR device.

This invention also provides an electrostatic discharge (ESD) protection circuit having an silicon-on-insulator (SOI) silicon control rectifier (SCR) device therein. The ESD protection circuit is coupled to an input/output pad and an internal circuit inside a silicon chip. The protection circuit includes an SOI-SCR device and an ESD discharge detection circuit. The SOI-SCR device has a cathode, an anode, a first gate and a second gate. The anode is coupled to the input/output pads and the cathode is coupled to a ground terminal. The ESD detection circuit is coupled to the input/output pad and the ground terminal, respectively. The ESD detection circuit further includes at least two output terminals for connecting with the first and the second gate of the SOI-SCR device, respectively This invention also provides an alternative electrostatic discharge (ESD) protection circuit having a silicon-on-insulator (SOI) silicon control rectifier (SCR) device therein. The ESD protection circuit is coupled to a first voltage source and a second voltage source. The circuit includes an SOI-SCR device, an ESD detection circuit and a diode series comprising a plurality of serially connected diodes. The SOI-SCR device has a cathode, an anode, a first gate and a second gate. The anode is connected to the first voltage source. The ESD detection circuit at least includes a pair of output terminals connected to the first gate and the second gate of the SCR device, respectively. The anode of the diode series is connected to the cathode of the SCR device while the cathode of the diode series is connected to the second voltage source.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
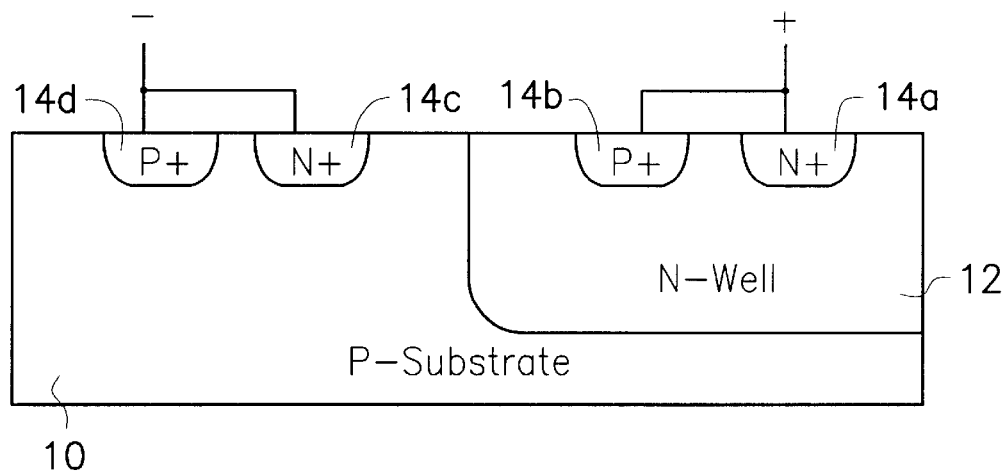
FIG. 1 is a schematic cross-sectional view of a conventional ESD protection SCR device.
Figure 2:
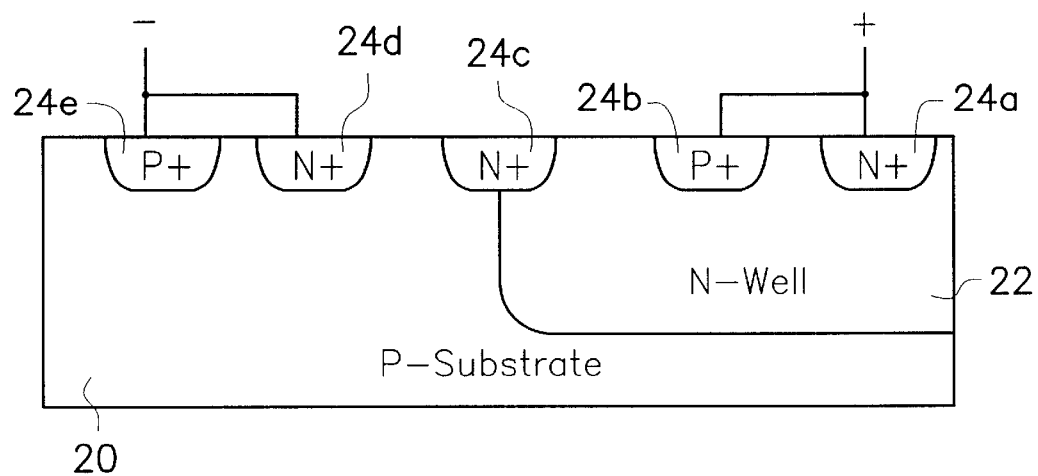
FIG. 2 is a schematic cross-sectional view of a conventional modified lateral SCR device for protecting circuit against ESD.
Figure 3:
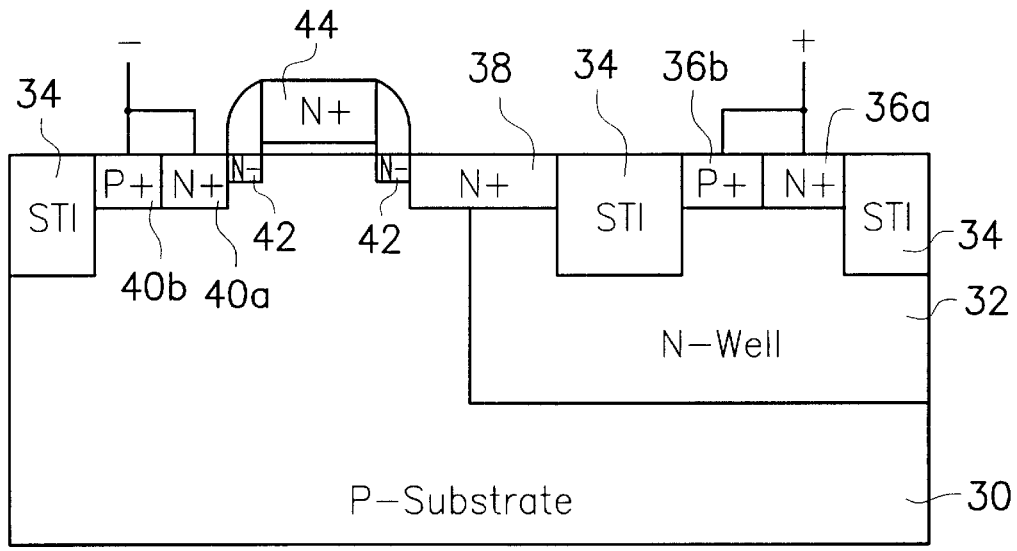
FIG. 3 is a schematic cross-sectional view of a low-voltage-triggered SCR device for protecting against ESD.
Figure 4:
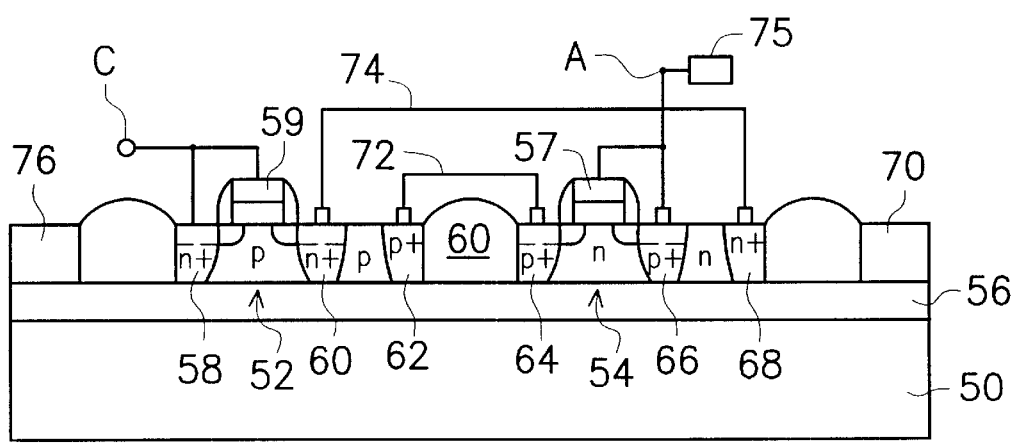
FIG. 4 is a schematic cross-sectional view of a conventional doubly stabilized SCR device and switching circuit structure fabricated on a silicon-on-insulator substrate.

Reference will now be made in detail to the present preferred embodiments of the invention, examples of which are illustrated in the accompanying drawings. Wherever possible, the same reference numbers are used in the drawings and the description to refer to the same or like parts.

Figure 5A:
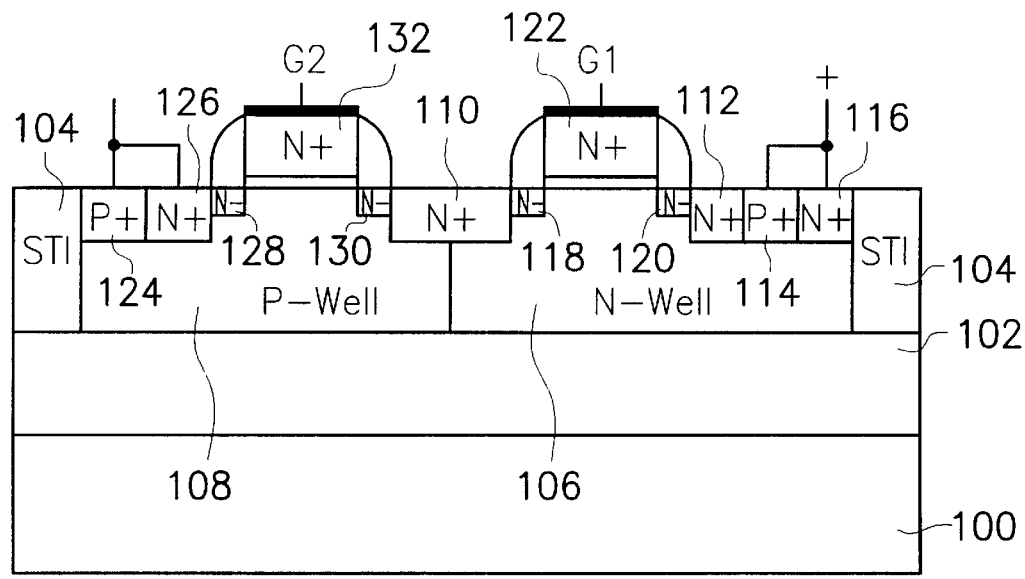
FIG. 5A is a schematic cross-sectional view showing a partially-depleted type SOI-SCR device structure according to a first embodiment of this invention.
Figure 5B:
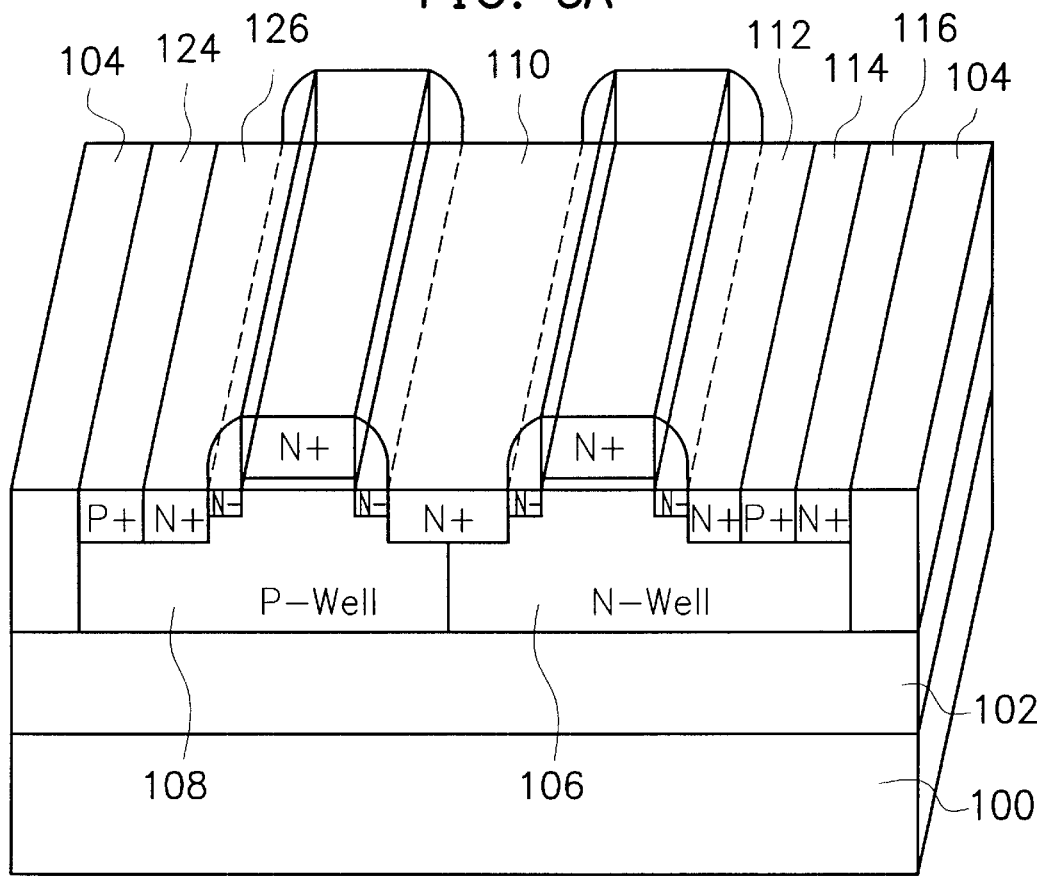
FIG. 5B is a perspective view of FIG. 5A.

FIG. 5A is a schematic cross-sectional view showing a partially-depleted type SOI-SCR device structure according to a first embodiment of this invention. FIG. 5B is a perspective view of FIG. 5A. To simplify the diagram, connection wires going to the cathode and anode are omitted in FIG. 5B.

As shown in FIGS. 5A and 5B, the silicon-on-insulator (SOI) silicon controlled rectifier (SCR) is built above a substrate 100 and an insulation layer 102 having a silicon layer thereon. The SOI-SCR device is formed in the silicon layer. The substrate 100 can be a P-type substrate and the insulation layer 102 can be an oxide layer, for example. A plurality of isolation structures 104 is formed over the insulation layer 102 for defining a device region among the isolation structures 104. The isolation structures can be a shallow trench isolation (STI) structures, for example. A first-type well 106 and a second-type well 108 are formed in the device region between neighboring isolation structures 104. The first well region 106 and the second well region 108 are joined together. In this embodiment, the first-type well is a lightly doped N-type well while the second-type well is a lightly doped P-type well.

The first-type well 106 has a first gate structure 122 thereon. Similarly, the second-type well 108 has a second gate structure 132 thereon. The gate structures 122/132 can have a structure identical to the gate of a conventional MOS transistor. For example, the gate structures 122/132 can have a gate oxide layer, a doped polysilicon layer (for example, heavily doped N-type polysilicon) and spacers on the sidewalls. The gate structures 122/132 serve as dummy gates for lowering the switching voltage of an SCR device. The well regions 106/108 underneath spacers of the first and the second gate structure 122/132 can be a lightly doped region, for example, N-type regions 120/118 and 130/128.

The first-type well 106 further includes a first second-type doped region 114 such as a heavily P-doped region and a first first-type doped region 116 such as a heavily N-doped region. The first first-type doped region 116 is formed inside the first-type well 106 between the first second-type doped region 114 and the isolation structure 104 adjacent to the first second-type doped region 114. The first second-type doped region ($P^+$-type) 114 and the first first-type doped region ($N^+$-type) 116 are electrically connected to form an anode of the SOI-SCR device. In addition, the first-type well 106 further includes a second first-type doped region 112 such as heavily doped N-type region formed between the first second-type doped region 114 and the first gate structure 122 adjacent to the first second-type doped region 114.

A third first-type doped region 110 such as a heavily $N^+$-doped region is located in the first-type well 106 and the second-type well 108 around their junction between the first and the second gate structures 122/132. The third first-type doped region 110 is formed by diffusion or ion implantation, for example.

The second-type well 108 further includes a second second-type doped region 124 such as a heavily $P^+$-doped region and a fourth first-type doped region 126 such as a heavily N+-doped region. The fourth first-type doped region 126 is formed within the second-type well 108 located between the second second-type doped region 124 and the second gate structure 132 adjacent to the second second-type doped region 124. The second second-type doped region 124 and the fourth first-type doped region 126 together form a cathode of the SOI-SCR device.

When a positive transition voltage is applied to the anode of the SCR device, the positive voltage triggers a current to flow in from the anode to the first-type well 106 via the first second-type doped region 114. If voltage level of the positive voltage is greater than the breakdown voltage of the junction between the third first-type doped region 110 and the second-type well 108, junction breakdown occurs. The breakdown current passes through the second-type well 108, the junction between the second-type well 108 and the fourth first-type doped region 126 and the fourth first-type doped region 126 to arrive at the cathode of the SCR device. Furthermore, the NMOS transistor that includes the second gate structure 132 can be triggered into a conductive mode so that current can flow from the first-type well 106 to the second-type well 108. In other word, a forward bias is applied to trigger the conductance of the SOI-SCR device.

When a negative transition voltage is applied to the anode of the SCR device, the negative voltage triggers a current to flow from the cathode into the second second-type doped region 124 and then the second-type well 108. Under such bias condition, the junction between the second-type well 108 and the first-type well 106 is forward bias and hence current will flow into the first-type well 106. Finally, current flows from the first-type well 106 into the cathode of the SOI-SCR device.

Figure 6A:
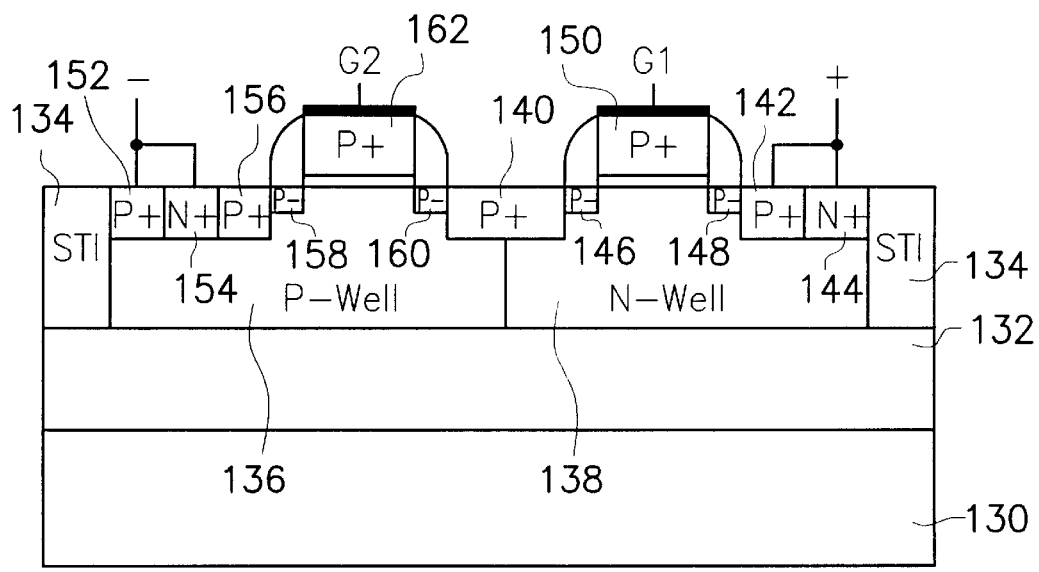
FIG. 6A is a schematic cross-sectional view showing a partially-depleted type SOI-SCR device structure according to a second embodiment of this invention.
Figure 6B:
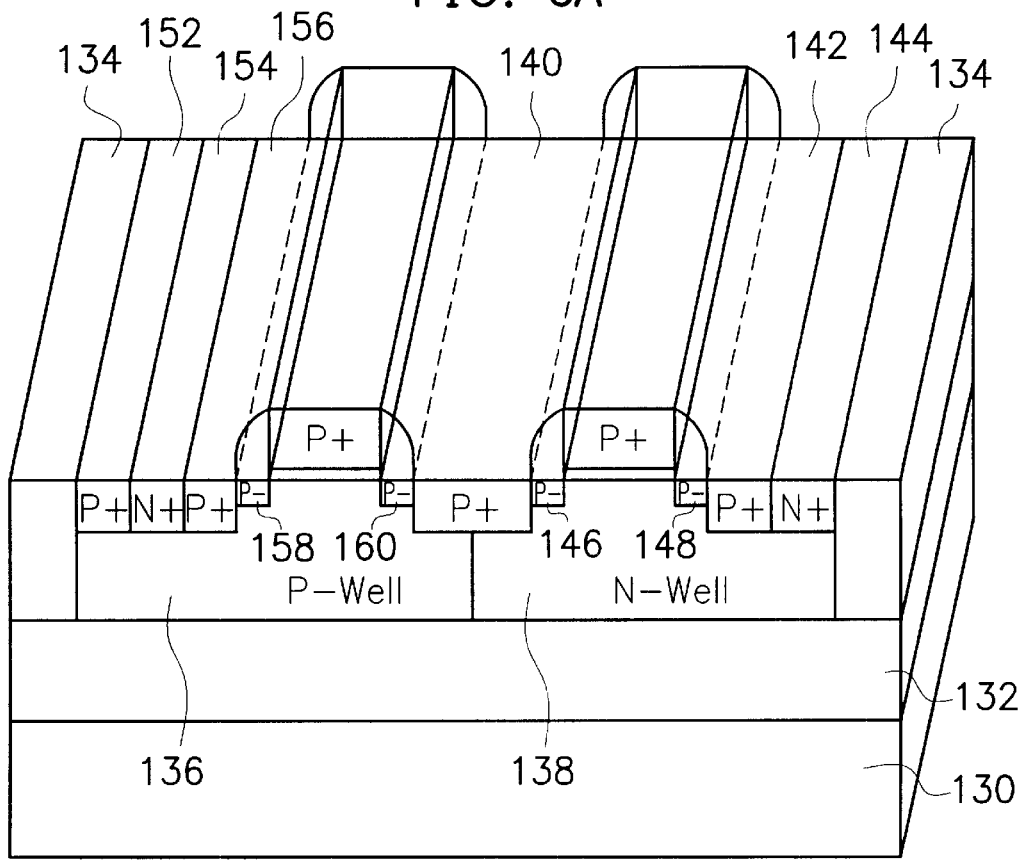
FIG. 6B is a perspective view of FIG. 6A.

FIG. 6A is a schematic cross-sectional view showing a partially-depleted type SOI-SCR device structure according to a second embodiment of this invention. FIG. 6B is a perspective view of FIG. 6A. To simplify the diagram, connection wires going to the cathode and anode are omitted in FIG. 6B. The structure shown in FIG. 6A illustrates the structural changes in FIG. 5A.

As shown in FIGS. 6A and 6B, the silicon-on-insulator (SOI) silicon controlled rectifier (SCR) is built above a substrate 130 (such as a P-type substrate) and an insulation layer 132 (a buried oxide layer) having a silicon layer thereon. The SOI-SCR device is formed in the silicon layer. A plurality of isolation structures 134 (such as shallow trench isolation (STI) structures) is formed over the insulation layer 132 for defining a device region among the isolation structures 134. A first-type well 138 (such as an N-type well) and a second-type well 136 (such as a P-type well) are formed in the device region between neighboring isolation structures 134. The first well region 138 and the second well region 136 are joined together.

The first-type well 138 has a first gate structure 150 thereon. Similarly, the second-type well 136 has a second gate structure 162 thereon. The well regions 138/136 underneath the spacers of the first and the second gate structure 150/162 can be a lightly doped region, for example, P-type regions 146/148 and 158/160.

The first-type well 138 further includes a first first-type doped (N+) region 114 and a second second-type doped (P+) region 142. The first first-type doped region 144 is formed in the first-type well 138 between the first second-type doped region 144 and the isolation structure 134 adjacent to the first second-type doped region 142. The first second-type doped region 142 and the first first-type doped region 144 are electrically connected to form an anode of the SOI-SCR device. In addition, a second second-type doped (P+) region 140 is formed within the first-type well 138 and the second-type well 136 around their junction between the first and the second gate structure 150/162.

The second-type well 136 further includes a second first-type doped (N+) region 154, a third second-type doped (P+) region 152 and a fourth second-type doped (P+) region 156. The third second-type doped region 152 is formed within the second-type well 136 between the second first-type doped region 154 and the isolation structure 134 and adjacent to the second first-type doped region 154. The second first-type doped region 154 and the third second-type doped region 152 together form a cathode of the SCR device. In addition, the fourth second-type doped region 156 is formed within the second-type well 136 between the second first-type doped region 154 and the second gate structure 162 and adjacent to the second first-type doped region 154.

Since the method of operating the SOI-SCR device in FIG. 6A is similar to the one shown in FIG. 5A, detailed description is omitted here.

Figure 7A:
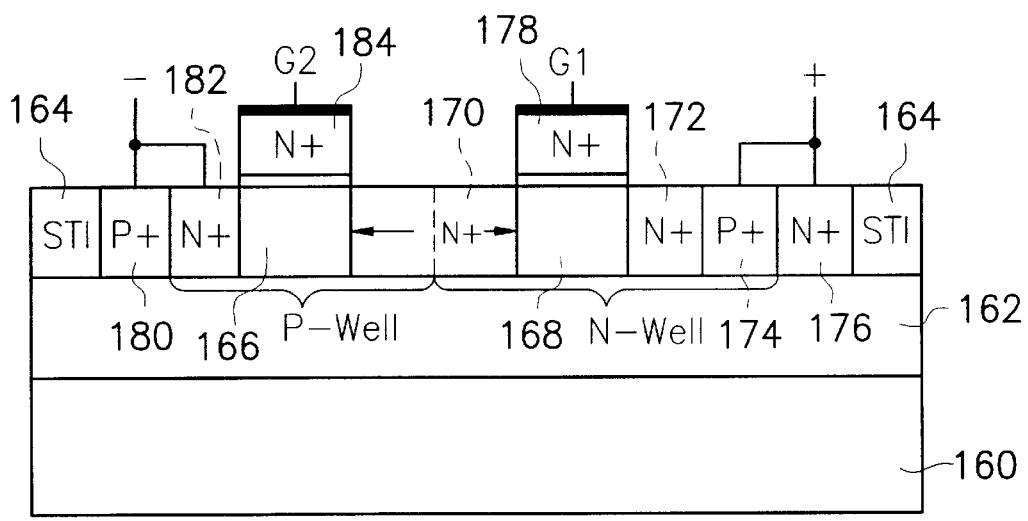
FIG. 7A is a schematic cross-sectional view showing a fully-depleted type SOI-SCR device structure according to a third embodiment of this invention.
Figure 7B:
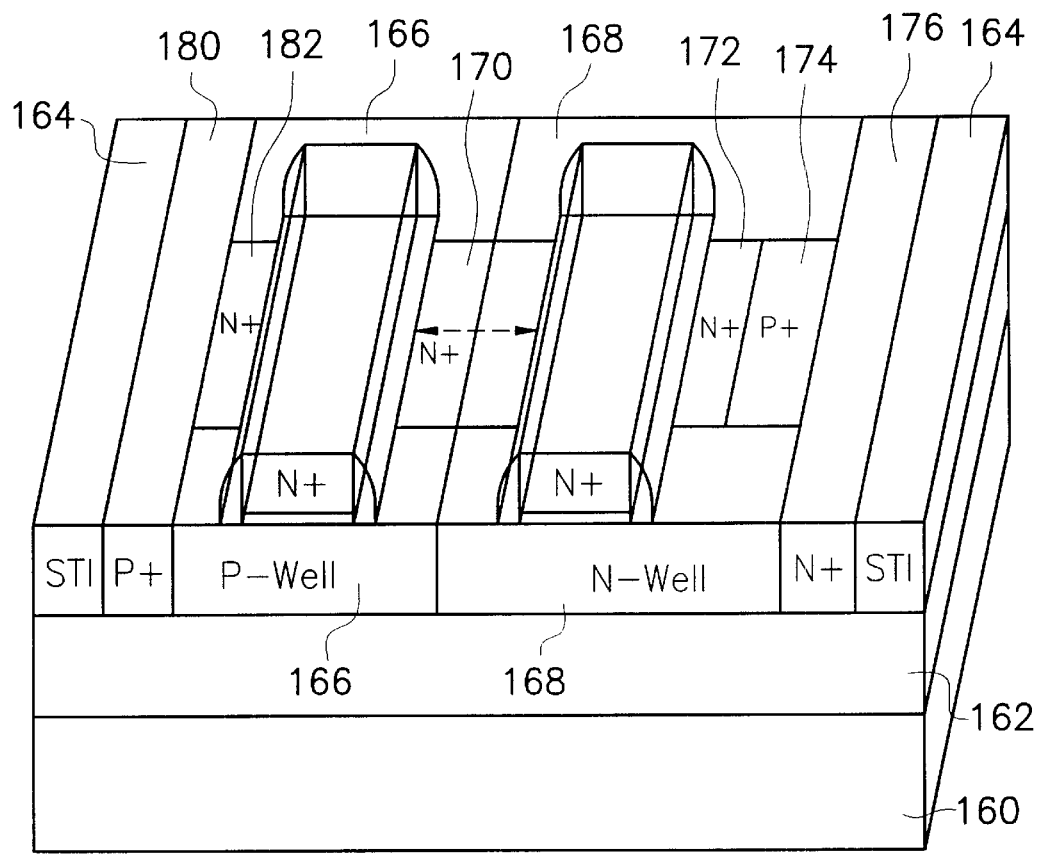
FIG. 7B is a perspective view of FIG. 7A.

FIG. 7A is a schematic cross-sectional view showing a fully-depleted type SOI-SCR device structure according to a third embodiment of this invention. FIG. 7B is a perspective view of FIG. 7A. To simplify the diagram, connection wires going to the cathode and anode are omitted in FIG. 7B.

As shown in FIGS. 7A and 7B, the silicon-on-insulator (SOI) silicon controlled rectifier (SCR) is built above a substrate 160 (such as a P-type substrate) and an insulation layer 162 (a buried oxide layer) having a silicon layer thereon. The SOI-SCR device is built in the silicon layer. A plurality of isolation structures 164 (such as shallow trench isolation (STI) structures) is formed over the insulation layer 162 for defining a device region among the isolation structures 164. A first-type well 168 (such as an N-type well) and a second-type well 166 (such as a P-type well) are formed in the device region between neighboring isolation structures 164. The first well region 168 and the second well region 166 are joined together. A first gate structure 178 is formed above the first-type well 168. Similarly, a second gate structure 184 is formed above the second-type well 166.

The first-type well 168 further includes a first first-type doped (N+) region 172 and a first second-type doped (P+) region 174. The first first-type doped region 172 is formed in the first-type well 168 adjacent to a portion of the sidewall of the first gate structure 178. In other words, the first first-type doped region 172 is implanted into a portion of the first-type well 168 only. As shown in FIG. 7B, length of the implanted region is smaller than the length of the gate 178. The first second-type doped region 174 is formed within a portion of the first-type well 168 adjacent to the first first-type doped region 172. Size of the first second-type doped region 174 is almost identical to the first first-type doped (N+) region 172. The second first-type doped (N+) 176 is formed in the device region between the first second-type doped region 174 and the isolation structure 164 adjacent to the first-type well 168. The first second-type doped region 174 and the second first-type doped region 176 together form an anode of the SOI-SCR device.

A third first-type doped region (N+) region 170 is formed within the first-type well 168 and the second-type well 166 around their junction between the sidewalls of a portion of the first and the second gate structure 178/184.

A second second-type doped (P+) 180 is formed in the device region adjacent to the second-type well 166. A fourth first-type doped (N+) region 182 is formed within a portion of the second-type well 166 between the second second-type doped region 180 and the sidewalls of a portion of the second gate structure 184. The second second-type doped region 180 and the fourth first-type doped region 182 together form a cathode of the SOI-SCR device. As shown in FIG. 7B, the implanted length of the fourth first-type doped region 182 is smaller than the length of the gate 184.

Since the method of operating the SOI-SCR device in FIG. 7A is similar to the one shown in FIG. 5A, detailed description is omitted here.

Figure 8A:
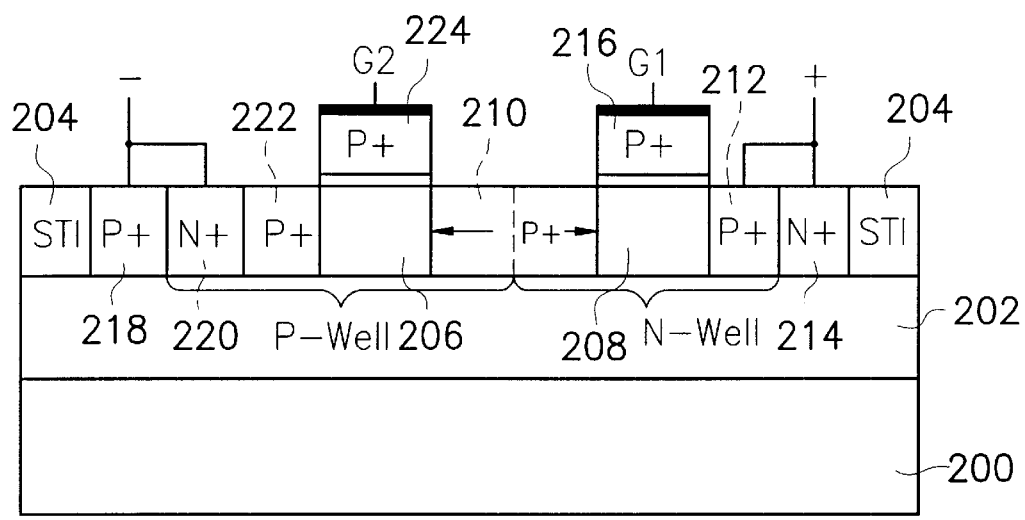
FIG. 8A is a schematic cross-sectional view showing a fully-depleted type SOI-SCR device structure according to a fourth embodiment of this invention.
Figure 8B:
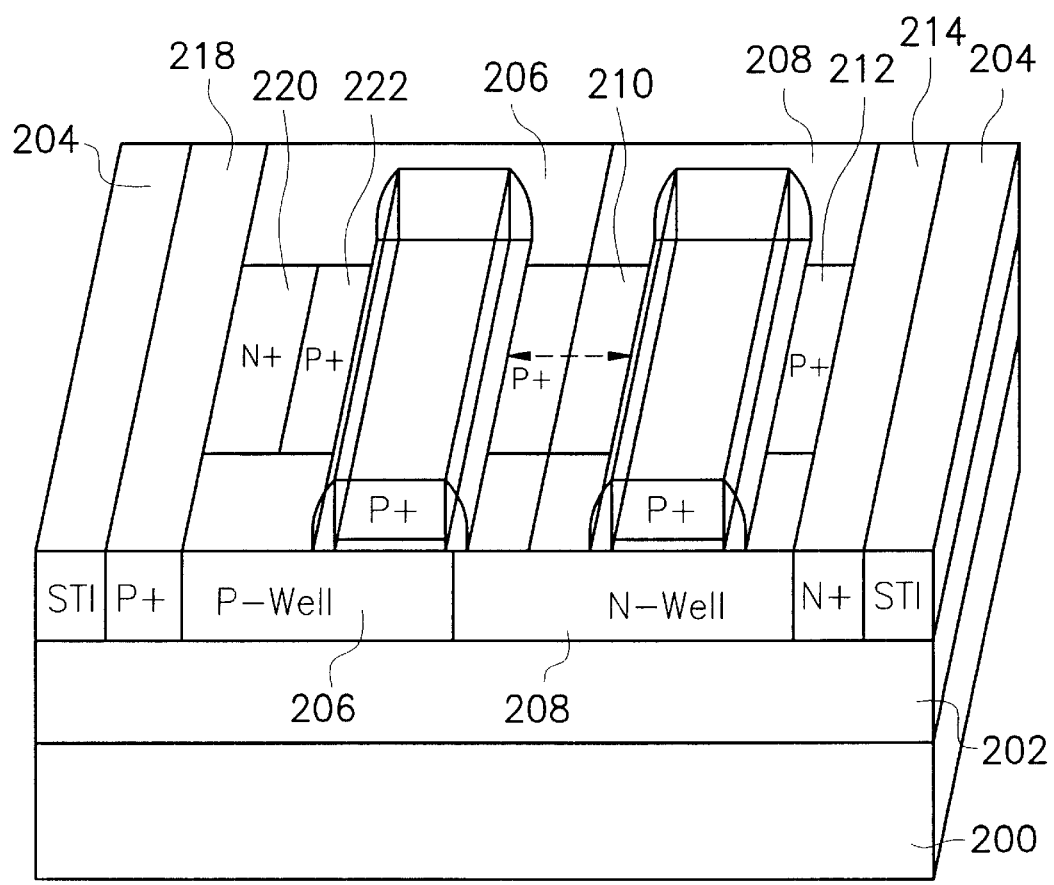
FIG. 8B is a perspective view of FIG. 8A.

FIG. 8A is a schematic cross-sectional view showing a fully-depleted type SOI-SCR device structure according to a fourth embodiment of this invention. FIG. 8B is a perspective view of FIG. 8A. To simplify the diagram, connection wires going to the cathode and anode are omitted in FIG. 8B. The structure shown in FIG. 8B is in fact a variation of the one shown in FIG. 7A.

As shown in FIGS. 8A and 8B, the silicon-on-insulator (SOI) silicon controlled rectifier (SCR) is built above a substrate 200 (such as a P-type substrate) and an insulation layer 202 (a buried oxide layer) having a silicon layer thereon. The SOI-SCR device is built in the silicon layer. A plurality of isolation structures 204 (such as shallow trench isolation (STI) structures) is formed over the insulation layer 202 for defining a device region among the isolation structures 204. A first-type well 208 (such as an N-type well) and a second-type well 206 (such as a P-type well) are formed in the device region between neighboring isolation structures 204. The first well region 208 and the second well region 206 are joined together. A first gate structure 216 is formed above the first-type well 208. Similarly, a second gate structure 224 is formed above the second-type well 216.

The first-type well 208 has a first second-type doped (P+) region 212 adjacent to the sidewalls of a portion of the first gate structure 216. In other words, the first second-type doped region 212 is implanted into a portion of the first-type well 208 only. As shown in FIG. 8B, length of the implanted portion is smaller than length of the first gate structure 216. A first first-type doped (N+) region 214 is formed within the device region between the first second-type doped region 212 and the isolation structure 204 and adjacent to the first-type well 208. The first second-type doped 212 and the first first-type doped region 214 are electrically connected to form an anode of the SOI-SCR device.

A second second-type doped region 210 is formed within the first-type well 208 and the second-type well 206 around their junction between the sidewalls of a portion of the first and the second gate structure 216/224.

A third second-type doped (P+) doped region 222 is formed within a portion of the second-type well 206 adjacent to the sidewall of the second gate structure 224. A second first-type doped (N+) region 220 is formed within a portion of the second-type well 206 adjacent to the third second-type doped region 222. In other words, only a portion of the third second-type doped region 222 and a portion of the second first-type doped region 220 are implanted into the second-type well 206. As shown in FIG. 8B, length of the implanted region is smaller than the length of the second gate structure 224. A fourth second-type doped (P+) region 218 is formed in the device region between the second first-type doped region 220 and another isolation structure 204 adjacent to the second-type well 206. The second first-type doped region 220 and the fourth second-type doped region 218 are electrically connected to form a cathode of the SOI-SCR device.

Since the method of operating the SOI-SCR device in FIG. 8A is similar to the one shown in FIG. 5A, detailed description is omitted here.

Figure 9A:
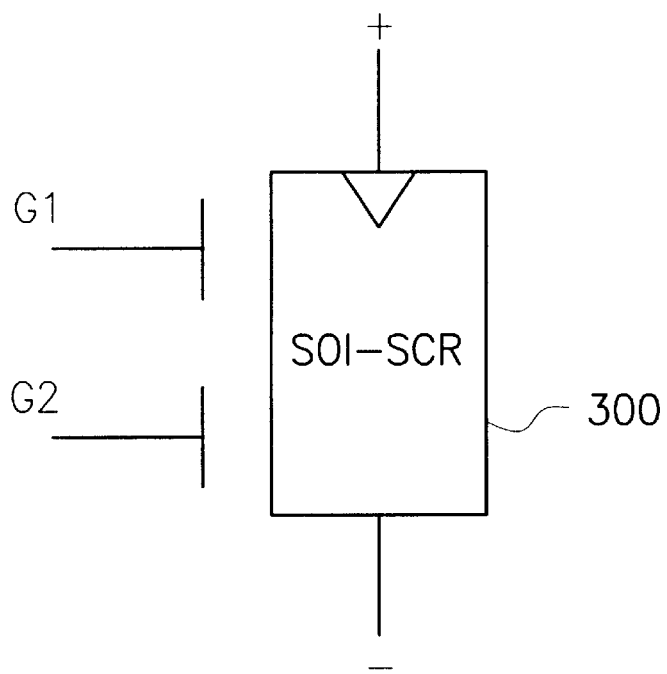
FIGS. 9A and 9B are block diagrams showing an SOI-SCR device according to the first to the fourth embodiment this invention.
Figure 9B:
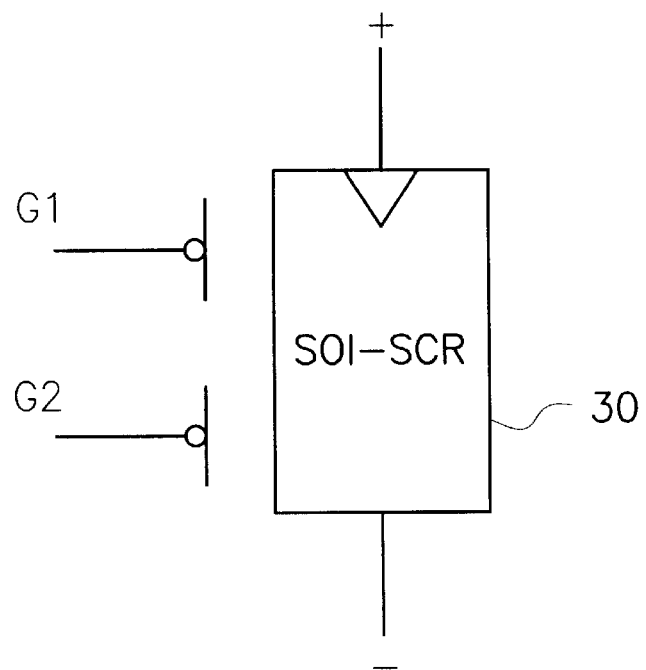

FIGS. 9A and 9B are block diagrams showing an SOI-SCR device according to the first to the fourth embodiment this invention. As shown in FIG. 9A, a N-type SOI-SCR device 300 is a four-terminal circuit device having an anode, a cathode and two gates G1 and G2. The gates G1 and G2 are N-doped gates which correspond to the structures shown in FIGS. 5A, 5B and 7A, 7B. In addition, as shown in FIG. 9B, P-type SOI-SCR device 302 is a circuit device with four terminals, including anode and cathode and two gates G1 and G2. The gates G1 and G2 are P-doped gates which correspond to the structures shown in FIGS. 6A, 6B and 8A, 8B.

The following description is made for the SOI-SCR device of this invention applicable to the ESD protection circuit on an IC circuit.

Figure 9C:
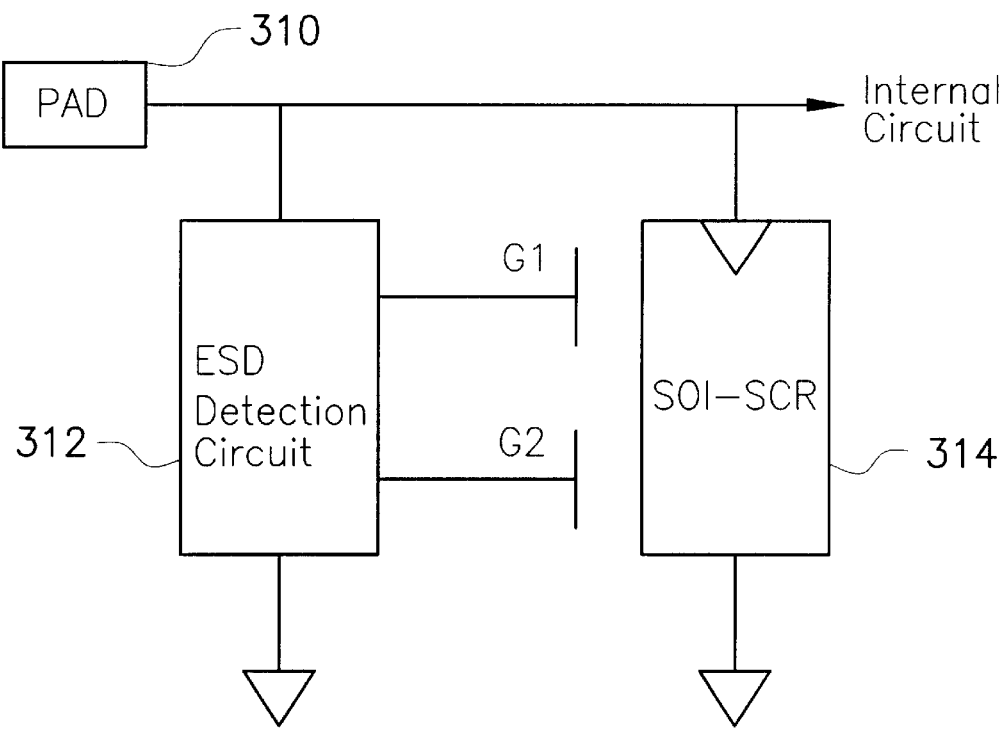
FIGS. 9C and 9D are circuit diagrams showing an electrostatic discharge protection circuit incorporating an SOI-SCR device according to this invention.

FIG. 9C is a circuit diagram illustrating an electrostatic discharge protection circuit incorporating an SOI-SCR device according to this invention. As shown in FIG. 9C, the ESD protection circuit together with the N-type SOI-SCR device are coupled to an input/output pad 310 and an internal circuit (not shown). Besides the N-type SOI-SCR device 314, the ESD protection circuit also includes an ESD detection circuit 312. The N-type SOI-SCR device 314 has a cathode, an anode, a first gate G1 and a second gate G2. The anode is coupled to the input/output pad 310 and the cathode is coupled to a ground terminal. The ESD detection circuit 312 has at least two output terminals that are electrically coupled to the first gate G1 and the second gate G2 of the SOI-SCR device 314, respectively.

Figure 9D:
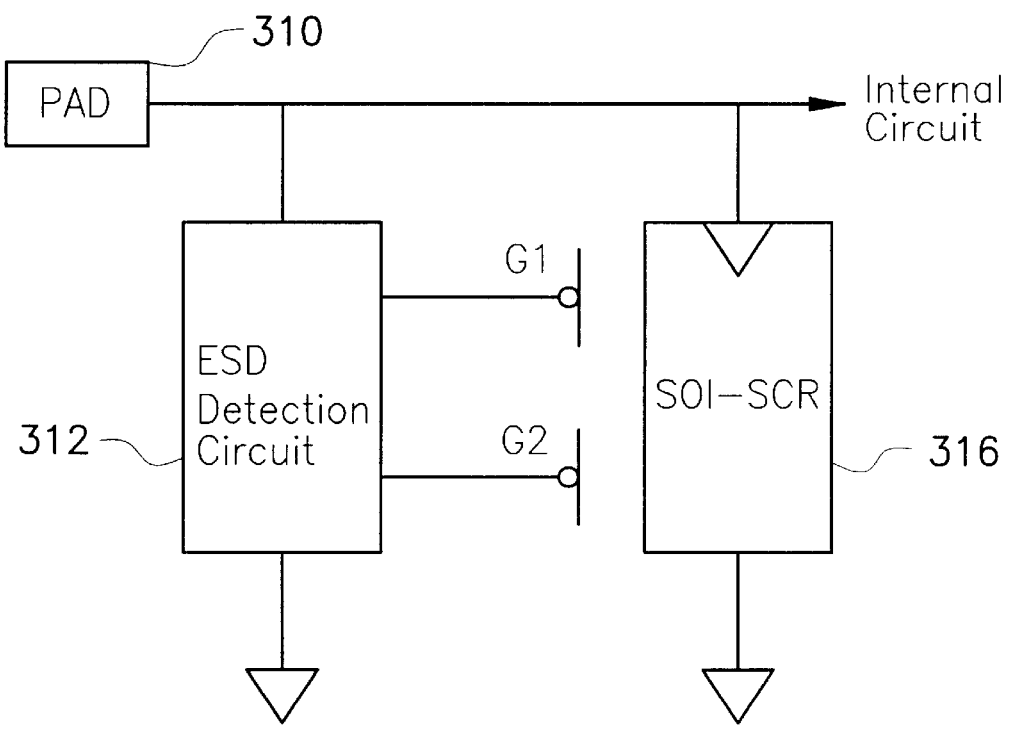

FIG. 9D is a circuit diagram illustrating an electrostatic discharge protection circuit incorporating a P-type SOI-SCR device according to this invention. FIG. 9C differs from FIG. 9D in that the N-type SOI-SCR device 314 shown in FIG. 9C is replaced by a P-type SOI-SCR device 316 in FIG. 9D.

The aforementioned N-type SOI-SCR device 314 can have any one of the internal configurations described in the first to the third embodiments of this invention. The internal configuration of the P-type SOI-SCR device 316 is selected from the second or the fourth embodiments, depending on actual design requirements. The ESD detection circuit 312 is used for detecting the occurrence of ESD incidence.

In normal operating mode, the ESD detection circuit 312 operates under a bias voltage so that the SOI-SCR device 314 remains off. When an ESD pulse is generated, the ESD detection circuit 312 is activated to operate in an alternate bias state, triggering the SOI-SCR device 314 into action and discharging excess static electricity. The ESD detection circuit 312 is a device for reducing the interval required to bring the SOI-SCR device 314 into a conducting state.

Figure 9E:
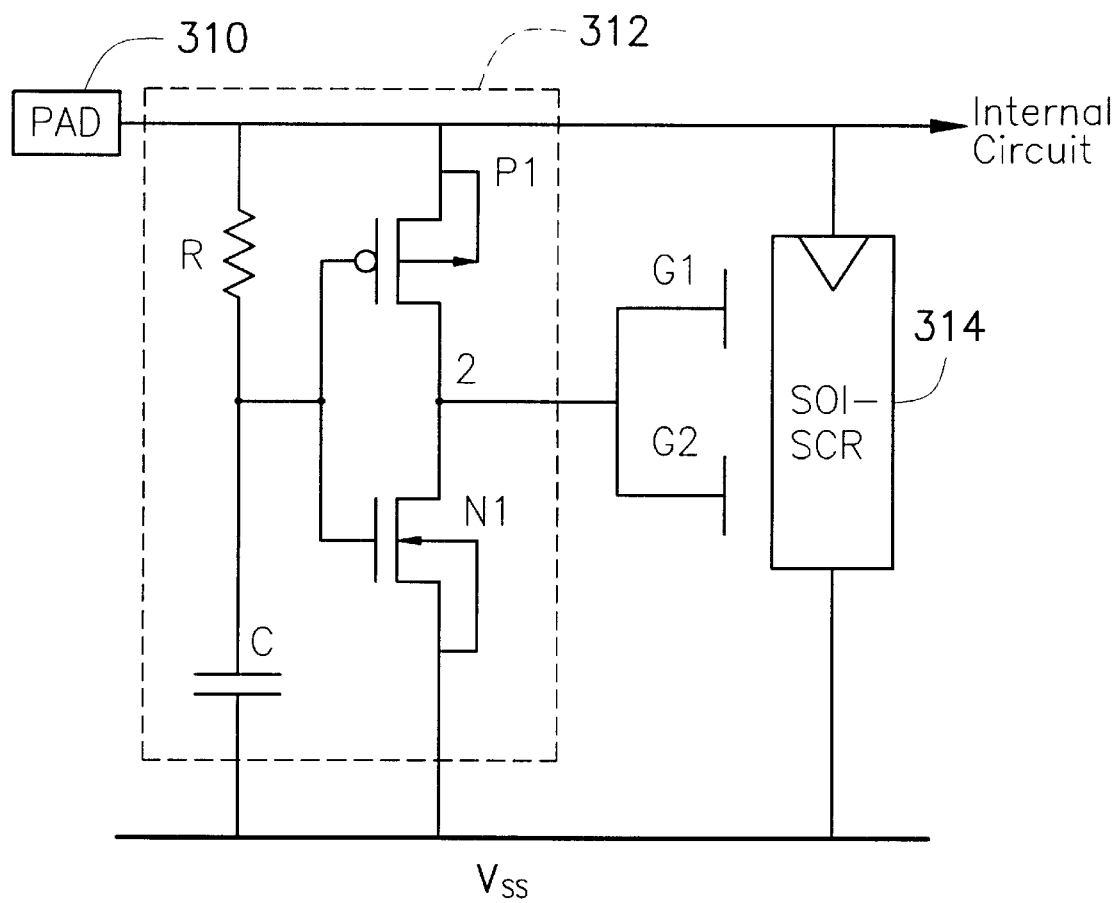
FIG. 9E is an example circuit of the circuit shown in FIG. 9C.

FIG. 9E is an example circuit of the circuit shown in FIG. 9C. As shown in FIG. 9E, the example is an illustration mainly of the internal circuitry of an ESD detection circuit 312. The example serves as an illustration only and by no means restricts the scope of this invention.

As shown in FIG. 9E, the ESD detection circuit 312 includes a second-type MOS transistor P1, a first-type MOS transistor N1, a resistor R, and a capacitor C. The source terminal of the second-type MOS transistor P1 is connected to an input/output pad 310, while the bulk and the source terminal of the second-type MOS transistor P1 are connected. The drain terminal of the first-type MOS transistor N1 is connected to the drain terminal of the second-type MOS transistor P1. The source terminal of the first-type MOS transistor N1 is connected to a ground terminal. The gate terminal of the first-type MOS transistor N1 is connected to the gate terminal of the second-type MOS transistor P1. Furthermore, the substrate and the source terminal of the first-type MOS transistor N1 are interconnected. The drain terminal of the first-type MOS transistor N1 and the second-type MOS transistor P1 are coupled to the first gate G1 and the second gate G2 of the SOI-SCR device 314. The resistor R is connected to the input/output pad 310 and the gate terminal of the second-type MOS transistor P1. The capacitor C is connected between the gate terminal of the second-type MOS transistor P1 and a ground terminal.

In normal operation mode, the node at the junction between the resistor R and the capacitor C remains at a high potential. After inversion (P1+N1), the drain terminal of the transistors P1 and N1 outputs a low potential. This low potential is fed into the first gate G1 and the second gate G2 of the SOI-SCR device 314 so that the SOI-SCR device 314 is shut off.

In the presence of an ESD voltage surge, a low potential is produced at the node junction between the resistor R1 and the capacitor C. After the inverting operation (by P1+N1), a low potential is sent to the first gate G1 so that the SOI-SCR device 314 is switched on. The SOI-SCR device 314 is conductive and an ESD current is channeled away without entering the internal circuit.

Figure 10A:
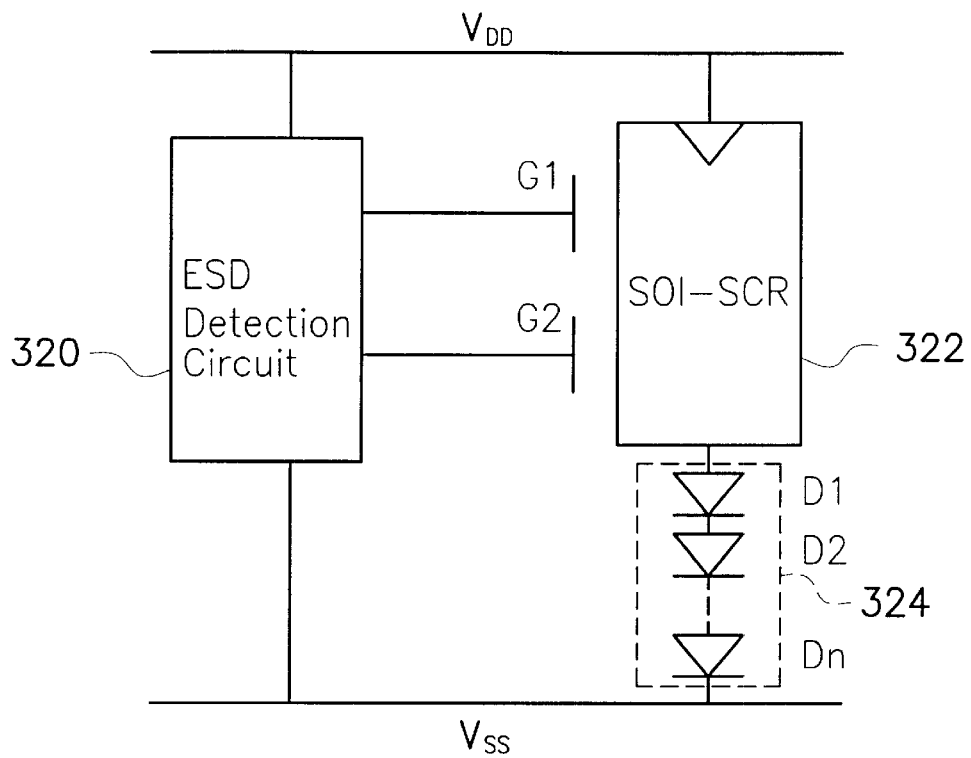
FIGS. 10A and 10B are circuit diagrams showing an alternative electrostatic discharge protection circuit having a SOI-SCR device therein according to this invention.
Figure 10B:
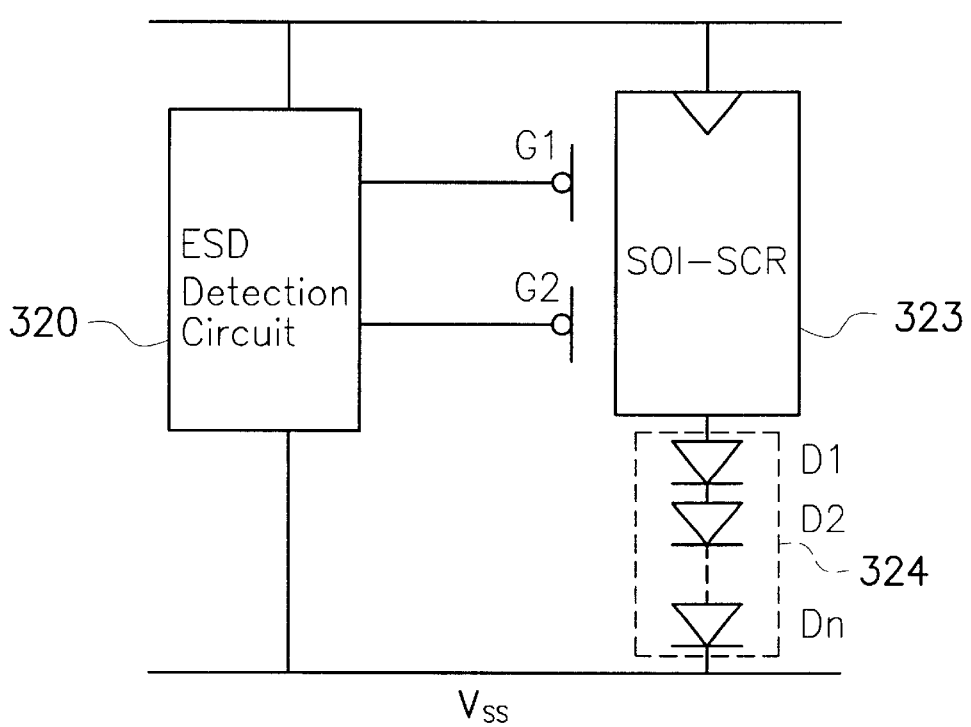

FIGS. 10A and 10B are block diagrams showing an alternative electrostatic discharge protection circuit having an SOI-SCR device therein according to this invention. As shown in FIG. 10A, the ESD protection circuit and the SOI-SCR device are coupled to a first voltage source $V_{DD}$ and a second voltage source $V_{SS}$. The circuit includes a N-type SOI-SCR device 322, an ESD detection circuit 320 and a diode series 324. The N-type SOI-SCR device 322 has a cathode, an anode, a first gate G1 and a second gate G2. The anode is connected to the first voltage source $V_{DD}$. The ESD detection circuit 320 is connected to first voltage source $V_{DD}$ and the second voltage source $V_{SS}$. The ESD detection circuit 320 at least includes two output terminals that connect with the first gate G1 and the second gate G2 of the N-type SOI-SCR device 322, respectively. The diode series comprises of a plurality of diodes D1, D2, . . . , Dn connected in series together. The anode of the diode series 324 is connected to the cathode of the N-type SOI-SCR device 322 while the cathode of the diode series 324 is connected to the second voltage source $V_{SS}$.

FIG. 10B is a circuit diagram illustrating an electrostatic discharge protection circuit incorporating a P-type SOI-SCR device according to this invention. FIG. 10A differs from FIG. 10B in that the N-type SOI-SCR device 322 shown in FIG. 10A is replaced by a P-type SOI-SCR device 323 in FIG. 10B.

The aforementioned N-type SOI-SCR device 322 can have any one of the internal configurations described in the first to the third embodiments of this invention. The internal configuration of the P-type SOI-SCR device 323 is selected from the second or the fourth embodiments, depending on actual design requirements. The ESD detection circuit 320 is used for detecting the occurrence of ESD incidence.

Figure 10C:
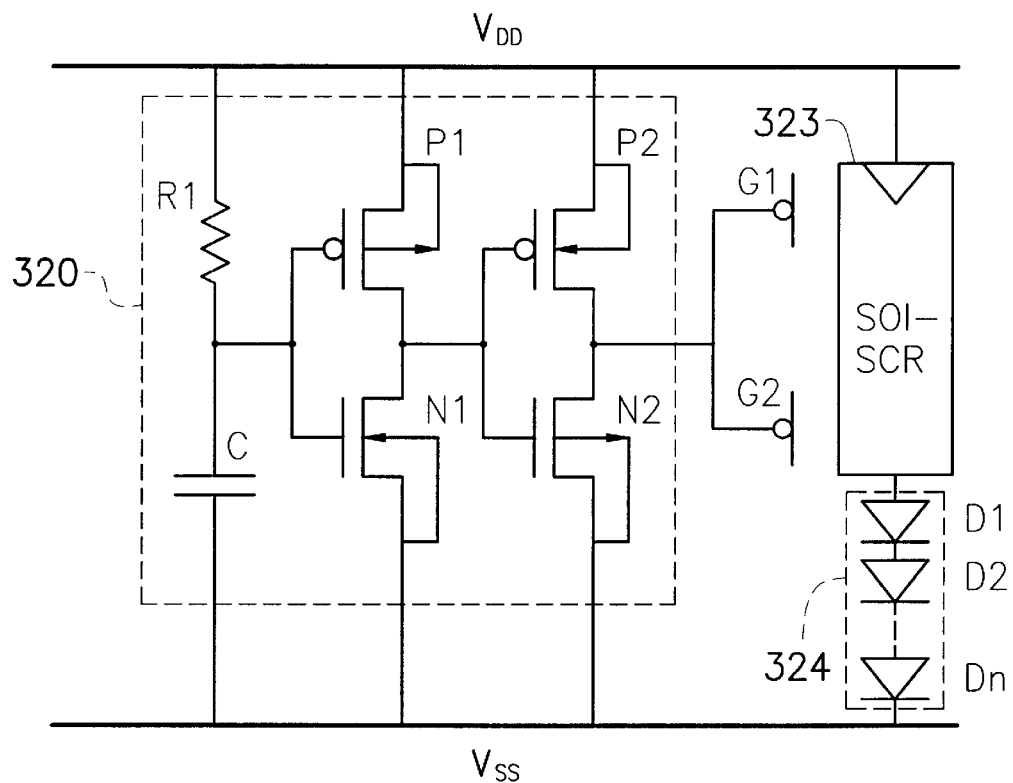
FIG. 10C is an example circuit of the circuit shown in FIG. 10B.

FIG. 10C is an example circuit of the circuit shown in FIG. 10B. As shown in FIG. 10C, the example is an illustration mainly of the internal circuitry of an ESD detection circuit 320. The example serves as an illustration only and by no means restricts the scope of this invention.

In normal operating mode, the ESD detection circuit 320 operates under a bias state so that the SOI-SCR device 323 remains off. In the presence of an ESD voltage surge, an alternative bias state is produced in the ESD detection circuit 320 triggering the SOI-SCR device 323 into action and discharging the static electricity. The ESD detection circuit 320 is a device that reduces the interval required to bring the SOI-SCR device 323 into a conducting state. The diode series 324 is a component for boosting the holding voltage when the SOI-SCR device 323 is conductive. The holding voltage must be greater than the potential drop between the first voltage source $V_{DD}$ and the second voltage source $V_{SS}$ so that latch-up problem can be avoided. In other words, the holding voltage is capable of preventing latch-up triggered by noise pulses during normal operation.

As shown in FIG. 10C, the ESD detection circuit 320 includes a first second-type MOS transistor P1 having a source terminal connected to a first voltage source $V_{DD}$ and a bulk connected to the source terminal. The circuit 320 also includes a first first-type MOS transistor N1 having a drain terminal connected to a drain terminal of the first second-type MOS transistor P1, a source terminal connected to a second voltage source $V_{SS}$, a gate terminal connected to the gate terminal of the first second-type MOS transistor P1, and a substrate connected to the source terminal. The circuit 320 further includes a second second-type MOS transistor P2 having a source terminal connected to the first voltage source $V_{DD}$, and a bulk connected to the source terminal. In addition, the circuit 320 includes a second first-type MOS transistor N2, with drain terminal connected to the drain terminal of the second second-type MOS transistor P2, a source terminal connected to the second voltage source $V_{SS}$, a gate terminal connected to the gate terminal of the second second-type MOS transistor P2, and a substrate connected to the source terminal. The gate terminals of the second first-type MOS transistor N2 and the second second-type MOS transistor P2 are both connected to the drain terminals of the first second-type MOS transistor P1 (and the first first-type MOS transistor N1). The drain terminals of the second second-type MOS transistor P2 and the second first-type MOS transistor N2 are connected to the first gate G1 and the second gate G2 of the P-type SOI-SCR device 323. The resistor R is connected to both the first voltage source $V_{DD}$ and the gate terminal of the first second-type MOS transistor P1. The capacitor C is connected between the gate terminal of the first second-type MOS transistor P1 and the second voltage source $V_{SS}$.

In normal operating mode, the node between the resistor R and the capacitor C remains at a high potential. After an inversion (by P1+N1) and another inversion (by P2+N2), the drain terminals of the transistors P2 and N2 output a high potential. The high potential signal is transmitted to the first gate G1 and the second gate G2 of the P-type SOI-SCR device 323 so as to lead a shutdown of the P-type SOI-SCR device 323.

In the presence of an ESD voltage surge, if the voltage surge is a positive voltage, a low potential is produced at the node between the resistor R and the capacitor C. After an inversion (by P1+N1) and another inversion (by P2+N2), a low potential is issued to the first gate G1 and the second gate G2 so that the P-type SOI-SCR device 323 is conducted. As the P-type SOI-SCR device 323 is conducted, static electricity is discharged away through the diode series 324 instead of flowing through the internal circuit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A silicon-on-insulator (SOI) silicon controlled rectifier device (SCR) structure, comprising:
   a substrate;
   an insulation layer above the substrate;
   a plurality of isolation structures above the insulation layer such that a device region is defined between the isolation structures;
   a first-type well region and a second-type well region, wherein the first-type well region and the second-type well region are connected and formed in the device region;
   a first gate structure above the first-type well;
   a second gate structure above the second-type well;
   a first second-type doped region inside the first-type well;
   a first first-type doped region inside the first-type well formed between the first second-type doped region and the isolation structure adjacent to the first second-type doped region, wherein the first second-type doped region and the first first-type doped region are electrically connected to form a cathode of the SOI-SCR device;
   a second first-type doped region formed inside the first-type well between the first second-type doped region and the first gate structure adjacent to the first second-type doped region;
   a third first-type doped region formed within the first and the second-type well around a junction of the first and second-type wells between the first and the second gate structure;
   a second second-type doped region formed within the second-type well; and
   a fourth first-type doped region formed within the second-type well between the second second-type doped region and the second gate structure adjacent to the second second-type doped region, wherein the second second-type doped region and the fourth first-type doped region are electrically connected to form an anode of the SOI-SCR device.

2. The device structure in claim 1, wherein the substrate includes a P-type substrate.

3. The device structure of claim 1, wherein the first-type well is a lightly doped N-type region and the second-type well is a lightly doped P-type region.

4. The device structure of claim 3, wherein the first and the second second-type doped region are heavily P-doped regions, and the first, the second, the third and the fourth first-type doped regions are heavily N-doped regions.

5. The device structure of claim 4, wherein the SOI-SCR device further includes two first lightly doped regions formed under the first gate structure adjacent to the third first-type doped region and the second first-type doped region, respectively.

6. The device structure of claim 5, wherein the two first lightly doped regions are N-type regions.

7. The device structure of claim 5, wherein the SOI-SCR device further includes two second lightly doped regions formed under the second gate structure adjacent to the third first-type doped region and the fourth first-type doped region, respectively.

8. The device structure of claim 7, wherein the two second lightly doped regions are N-type regions.

9. The device structure of claim 1, wherein the isolation structures include shallow trench isolation (STI) structures.

10. The device structure of claim 1, wherein the insulation layer includes a buried oxide layer.

11. A silicon-on-insulator (SOI) silicon controlled rectifier (SCR) device structure, comprising:
    a substrate;
    an insulation layer above the substrate;
    a plurality of isolation structure above the insulation layer such that a device region is formed between the isolation structures,
    a first-type well and a second-type well, wherein the first and the second-type wells are connected and formed in the device region;
    a first gate structure formed in the first-type well;
    a second gate structure formed in the second-type well;
    a first second-type doped region formed in the first-type well adjacent to the first gate structure;
    a first first-type doped region formed in the first-type well between the first second-type doped region and the isolation structure adjacent to the first second-type doped region, wherein the first second-type doped region and the first first-type doped region are electrically connected to form a cathode of the SOI-SCR device;
    a second second-type doped region formed in the first-type and the second-type well around a junction between the first and second-type wells between the first and the second gate structure;
    a second first-type doped region formed in the second well;
    a third second-type doped region formed in the second-type well between the second first-type doped region and the isolation structure adjacent to the second first-type doped region, wherein the second first-type doped region and the third second-type doped region are electrically connected to form an anode of the SOI-SCR device; and
    a fourth second-type doped region formed in the second well between the second first-type doped region and the second gate structure adjacent to the second first-type doped region.

12. The device structure of claim 11, wherein the substrate includes a P-type substrate.

13. The device structure of claim 11, wherein the first-type well is a lightly doped N-type region and the second-type well is a lightly doped P-type region.

14. The device structure of claim 13, wherein the first and the second first-type doped region are heavily doped N-type regions, and the first, the second, the third and the fourth second-type doped region are heavily doped P-type regions.

15. The device structure of claim 14, wherein the SOI-SCR device further includes two first lightly doped regions formed under the first gate structure adjacent to the first second-type doped region and the second second-type doped region, respectively.

16. The device structure of claim 15, wherein the two first lightly doped regions are P-type regions.

17. The device structure of claim 15, wherein the SOI-SCR device further includes two second lightly doped regions formed under the second gate structure adjacent to the second second-type doped region and the fourth second-type doped region, respectively.

18. The device structure of claim 17, wherein the two second lightly doped regions are P-type regions.

19. The device structure of claim 11, wherein the isolation structures include shallow trench isolation (STI) structures.

20. The device structure of claim 11, wherein the insulation layer includes a buried oxide layer.

21. A silicon-on-insulator (SOI) silicon controlled rectifier (SCR) device structure, comprising:

a substrate;

an insulation layer above the substrate;

a plurality of isolation structure above the insulation layer such that a device region is formed between the isolation structures;

a first-type well and a second-type well, wherein the first and the second-type wells are connected and formed in the device region;

a first gate structure formed above the first-type well;

a second gate structure formed above the second-type well;

a first first-type doped region formed in the first-type well adjacent to a portion of a sidewall of the first gate structure;

a first second-type doped region formed within a portion of the first-type well adjacent to the first first-type doped region;

a second first-type doped region formed in the device region between the first second-type doped region and the isolation structure adjacent to the first-type well, wherein the first second-type doped region and the second first-type doped region are electrically connected to form a cathode of the SOI-SCR device;

a third first-type doped region formed within the second-type well and the second-type well around a junction of the first and second-type wells between a portion of sidewalls between the first and the second gate structure;

a second second-type doped region formed in the device region adjacent to the second-type well; and a fourth first-type doped region formed within a portion of the second-type well between the second second-type doped region and a portion of a sidewall of the second gate structure, wherein the second second-type doped region and the fourth first-type doped region are electrically connected to form an anode of the SOI-SCR device.

22. The device structure of claim 21, wherein the substrate includes a P-type substrate.

23. The device structure of claim 21, wherein the first-type well is a lightly doped N-type region and the second-type well is a lightly doped P-type region.

24. The device structure of claim 23, wherein the first and the second second-type doped region are heavily doped P-type regions, and the first, the second, the third and the fourth first-type doped region are heavily doped N-type regions.

25. The device structure of claim 21, wherein the isolation structures include shallow trench isolation (STI) structures.

26. The device structure of claim 21, wherein the insulation layer includes a buried oxide layer.

27. A silicon-on-insulator (SOI) silicon controlled rectifier (SCR) device structure, comprising:

a substrate;

an insulation layer above the substrate;

a plurality of isolation structure above the insulation layer such that a device region is formed between the isolation structures;

a first-type well and a second-type well, wherein the first and the second-type wells are connected and formed in the device region;

a first gate structure formed above the first-type well;

a second gate structure formed above the second-type well;

a first second-type doped region formed in the first-type well adjacent to a portion of a sidewall of the first gate structure;

a first first-type doped region formed in the device region between the first second-type doped region and the isolation structure adjacent to the first second-type doped region, wherein the first second-type doped region and the first first-type doped region are electrically connected to form a cathode of the SOI-SCR device;

a second second-type doped region formed between a portion of the first and the second-type well around a junction of the first and second-type wells between a portion of sidewalls of the first and the second gate structure;

a third second-type doped region formed within a portion of the second-type well adjacent to a portion of the sidewall of the second gate structure;

a second first-type doped region formed within a portion of the second-type well adjacent to the third second-type doped region; and a fourth second-type doped region formed in the device region between the second first-type doped region and another isolation structure adjacent to the second-type well, wherein the second first-type doped region and the fourth second-type doped region are electrically connected to form an anode of the SOI-SCR device.

28. The device structure of claim 27, wherein the substrate includes a P-type substrate.

29. The device structure of claim 28, wherein the first-type well is a lightly doped N-type region and the second-type well is a lightly doped P-type region.

30. The device structure of claim 29, wherein the first and the second first-type doped region are heavily doped N-type regions, and the first, the second, the third and the fourth first-type doped region are heavily doped P-type regions.

31. The device structure of claim 27, wherein the isolation structures include shallow trench isolation (STI) structures.

32. The device structure of claim 27, wherein the insulation layer includes a buried oxide layer.

* * * * *